US006403969B1

(12) United States Patent
Mera et al.

(10) Patent No.: US 6,403,969 B1
(45) Date of Patent: Jun. 11, 2002

(54) ION IMPLANTATION SYSTEM AND ION IMPLANTATION METHOD

(75) Inventors: Kazuo Mera; Hiroyuki Tomita, both of Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/555,886

(22) PCT Filed: Dec. 12, 1997

(86) PCT No.: PCT/JP97/04587

§ 371 (c)(1),
(2), (4) Date: Jun. 8, 2000

(87) PCT Pub. No.: WO99/31705

PCT Pub. Date: Jun. 24, 1999

(51) Int. Cl.[7] .......................... H01J 37/20; H01J 37/317
(52) U.S. Cl. ............................... 250/443.1; 250/442.11; 250/492.21; 250/492.2; 250/398
(58) Field of Search .......................... 250/443.1, 442.11, 250/492.21, 492.2, 398

(56) References Cited

U.S. PATENT DOCUMENTS 4,832,777 A * 5/1989 Davis et al. ................ 156/345

FOREIGN PATENT DOCUMENTS

| JP | 3066122 | 3/1991 |
|----|---------|--------|
| JP | 8329879 | 12/1996 |

* cited by examiner

*Primary Examiner*—Bruce Anderson
*Assistant Examiner*—Nikita Wells
(74) *Attorney, Agent, or Firm*—Mattingly, Stanger & Malur, P.C.

(57) ABSTRACT

It is an object of the present invention to heat wafers uniformly at a high temperature at all times regardless of the scanning motion of a rotary disk holding the wafers.

A heater housing (11) for heating the wafers is mounted on a swing box (9) for mechanical scanning and a heater (12) is disposed so as to be opposite to wafers (5). The heater (12) moves together with a rotary disk (7). Therefore, the wafers can be uniformly heated at a high temperature even if the rotary disk (7) is moved for mechanical scanning because the heater (12) moves in synchronism with the rotary disk (7).

9 Claims, 5 Drawing Sheets

ION IMPLANTATION SYSTEM AND ION IMPLANTATION METHOD

TECHNICAL FIELD

The present invention relates to an ion implantation system and an ion implantation method and, more particularly, to an ion implantation system and an ion implantation method suitable for introducing various ions including oxygen ions into silicon wafers.

BACKGROUND ART

Recently, an ion implantation system for separation by implanted oxygen (hereinafter abbreviated to "SiMOX") has been developed. The ion implantation system for SiMOX introduces oxygen ions in a surface region of a predetermined depth of a silicon wafer, and subjects the silicon wafer to an annealing process to form a $SiO_2$ layer in the silicon wafer. When the $SiO_2$ layer is used as an insulating substrate, the wafer capable of quick response, as compared with that of a conventional wafer having a silicon layer formed on a $SiO_2$ substrate, can be realized.

The ion implantation system for SiMOX carries out a high-temperature process in which an ion beam is applied to a wafer uniformly heated at 100° C. or above. The temperature of the wafer is an important factor, and various wafer heating systems and various heating structures have been used.

Generally, when irradiating a plurality of wafers held by a wafer holder, i.e., a wafer holding means, with an ion beam, the wafer holder is rotated and the wafers turning together with the wafer holder are irradiated with the ion beam intermittently to reduce thermal stress that may be induced in the wafers by the ion beam. If the intensity distribution of the ion beam is less than a necessary accuracy of implantation uniformity, the ion beam must be converged to some extent and the ion beam must be projected so as to move relative to the wafers for scanning.

A scanning system in which the wafers are kept stationary and the beam is moved for scanning is called a beam scanning system. A scanning system in which the ion beam is kept stationary and the wafers are moved for scanning is called a mechanical scanning system. Since the latter system rotates a wafer holder holding wafers to move the wafers relative to an ion beam for scanning, it is difficult to determine the position of a heating mechanism for heating the wafers. Generally, the heating mechanism is disposed fixedly on a scanning path relative to the wafer holder and heats the wafers as the wafers pass by the heating mechanism.

This conventional system is unable to heat the wafers sufficiently in regions other than a region in the vicinity of the heating mechanism. Therefore, the wafers cannot be uniformly heated at a high temperature, ions are implanted at a low efficiency and the efficiency of the system is low. This may be prevented by using a large heating mechanism having a high heating ability and heating for a long time, which, however, enlarges the system and reduces efficiency greatly.

The present invention has been made in view of the foregoing problems and it is therefore an object of the present invention to provide an ion implanting system and an ion implantation method capable of uniformly heating wafers at a high temperature at all times regardless of the scanning motion of a wafer holding means.

DISCLOSURE OF INVENTION

To achieve the object, the present invention provides an ion implanting system comprising a heating means for heating wafers held by a wafer holding means, and a relative position changing means for changing the position of the wafer holding means relative to an ion beam in a plane substantially perpendicular to the ion beam, wherein the heating means and the relative position changing means move synchronously.

When the wafer holding means includes a rotary disk capable of holding a plurality of wafers on its peripheral part and the relative position changing means includes a rotating means for rotating the rotary disk in a plane substantially perpendicular to the ion beam and a swinging means for swinging the rotary disk in a plane substantially perpendicular to the ion beam, the heating means is combined with the swinging means, and the swinging means and the heating means move synchronously.

When the rotating means for rotating the rotary disk has a driving mechanism installed in a swing box to rotate the rotary disk about an axis of rotation, and the swinging means for swinging the rotary disk reciprocates the rotary disk laterally about a swinging axis relative to the ion beam to move the rotary disk for scanning, the heating means is combined with the swinging means, and the heating means moves in synchronism with the scanning movement of the rotary disk.

To achieve the object, the present invention provides an ion implantation method that introduces ions having a predetermined mass and separated from an ion beam projected by an ion source into a heated wafer while moving in synchronism with a relative position changing means that changes the position of the ion beam.

The ion implantation method is characterized in rotating a rotary disk holding a plurality of wafers on its peripheral part and swinging the rotary disk in a plane perpendicular to the ion beam by a swinging means when introducing the ions having the predetermined mass and separated from the ion beam projected by an ion source into the wafers.

The ion implantation method is characterized in rotating a rotary disk holding a plurality of wafers on its peripheral part to turn the wafers by a driving mechanism disposed in a swing box when introducing ions having a predetermined mass and separated from an ion beam projected by an ion source into the wafers, and laterally reciprocating the swing box relative to the ion beam to apply the ion beam to the heated wafers while the rotary disk moves in synchronism with a scanning operation of the swing box.

The heating means remains at an optimum heating position and is able to perform the same scanning operation as the wafer holding means even if the wafer holding means (rotary disk) holding the wafers performs a scanning operation. Therefore, the wafers can be most properly heated at all times regardless of the scanning position of the wafer holding means to achieve the foregoing object.

BEST MODE FOR CARRYING OUT THE INVENTION

An ion implanting system in a preferred embodiment according to the present invention will be described with reference to the accompanying drawings.

Figure 1:
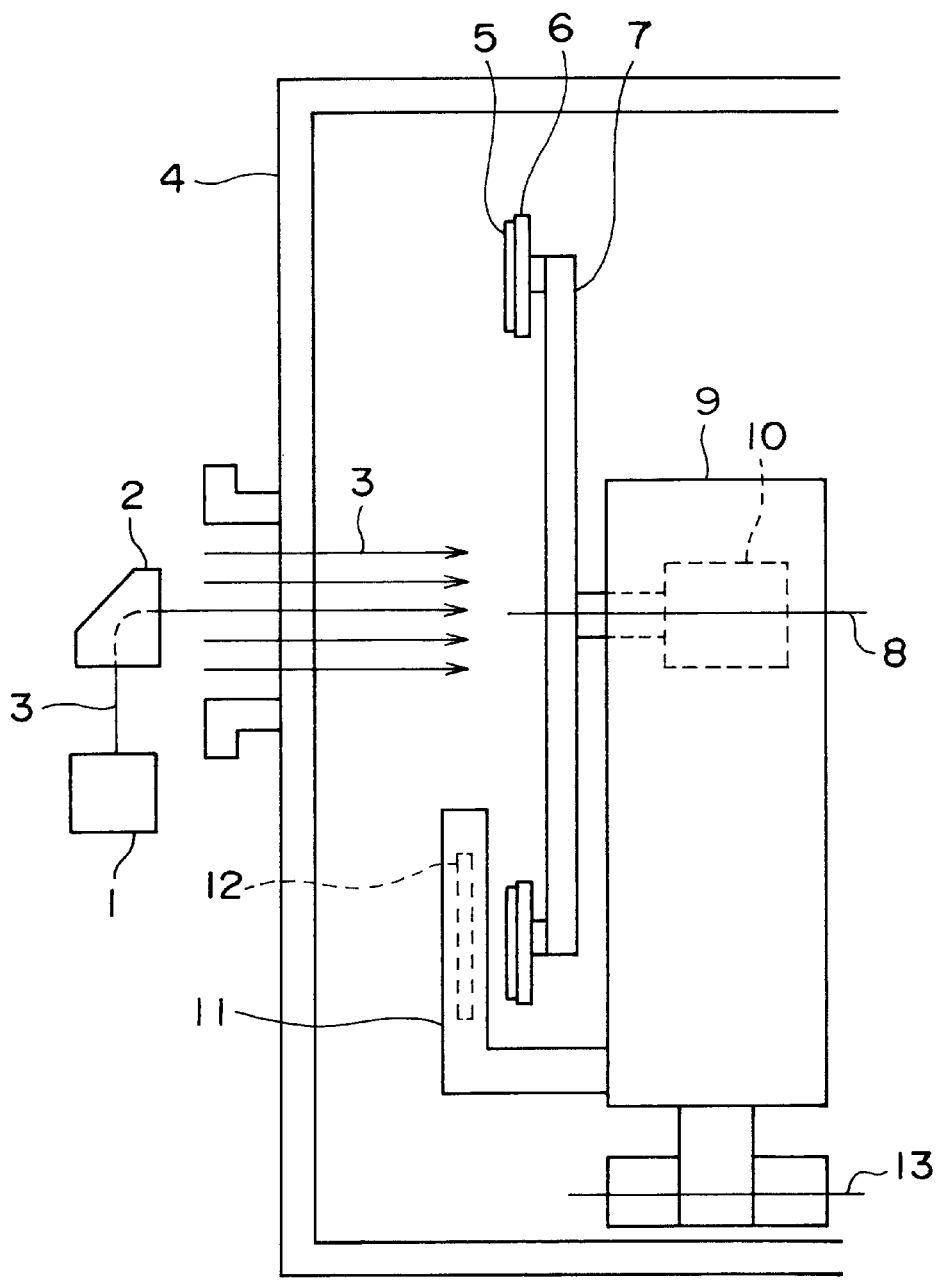
FIG. 1 is a diagrammatic view of an ion implanting system in a preferred embodiment according to the present invention.

FIG. 1 is a schematic view of an ion implanting system in a preferred embodiment according to the present invention for SiMOX.

As shown in FIG. 1, ions having a predetermined mass, i.e., ions for implantation, such as oxygen ions, are separated from an ion beam projected by an ion source 1 by a mass analyzing system 2. An ion beam 3 projected by the mass analyzing system 2 travels through an ion beam entrance formed in an end station 4 into the end station 4. The ion source 1, the mass analyzing system 2 and the end station 4 are contained in a hermetically sealed vessel and the interiors thereof are kept at a vacuum.

A rotary disk 7 is disposed in the end station 4. A plurality of wafer holders 6 are arranged in a peripheral part of the rotary disk 7, and wafers 5, such as silicon wafers, are held by the wafer holders 6. The wafer holders 6 holding the wafers 5 are arranged at equal angular intervals on the rotary disk 7. The rotary disk 7 is driven for rotation about an axis 8 by a motor 10 disposed in a swing box 9. The swing box 9 is reciprocated in a plane perpendicular to the paper by a scanning mechanism (swinging means) so as to turn into the paper and to turn out of the paper on a scanning shaft 13. In this embodiment, the motor 10 and a scanning mechanism (swinging means) constitute a relative position changing means. Generally, the ion beam 3 has a small sectional area as compared with that of the wafers 5 fixed to the wafer holders 6. Therefore, the ions can be introduced into the entire surface of the wafers 5 by rotating and reciprocating the rotary disk 7.

Figure 2:
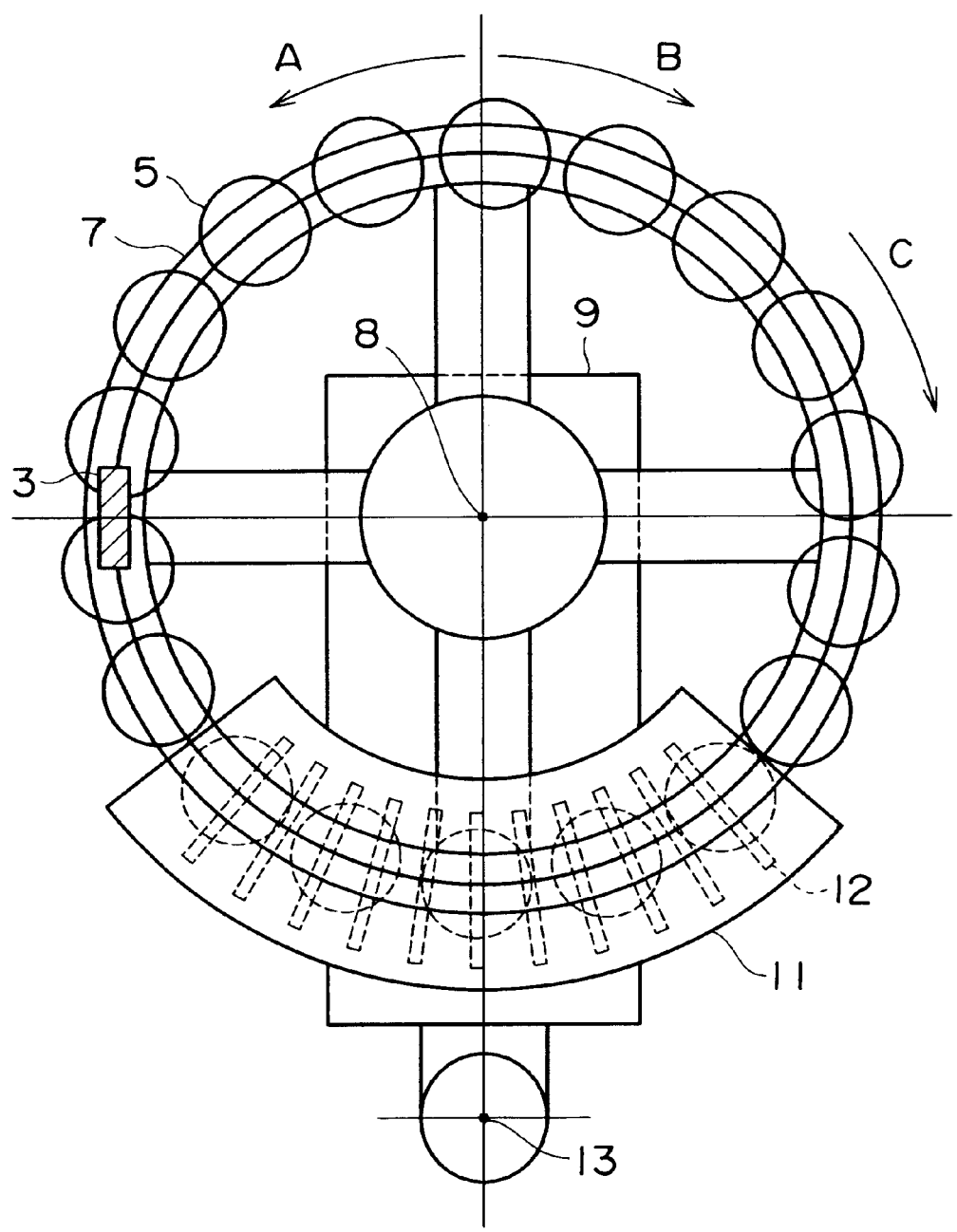
FIG. 2 is a front elevation of a rotary disk included in the first embodiment of the present invention.

In this embodiment, a heater housing 11 is disposed at a position corresponding to a lower part of the swing box 9 so as to face the wafers 5. A heater 12, i.e., a heating means, is disposed in a part of the heater housing 11 facing the wafers 5 in a lower section of the rotary disk 7. FIG. 2 is a front elevation of the rotary disk 7.

A preparation chamber, not shown, through which wafers 5 are loaded into and unloaded from the end station 4 is connected to the back of the end station 4. A carrying robot for carrying wafers 5 and wafer cassettes for storing wafers 5 are disposed in the preparation chamber. The carrying robot takes out wafers 5 from a wafer cassette, moves a tip thereof in the end station 4, and mounts the same on the wafer holders 6. After the completion of an ion implanting process, the carrying robot removes the wafers 5 from the wafer holders 6 and put the wafers 5 into a wafer cassette.

Referring to FIG. 2, the wafer holder 6 holding the wafers 5 are disposed in the peripheral part of the rotary disk 7. When the wafer holder 6 holding the wafer 5 is located at an irradiating position, the wafer 5 is irradiated with the ion beam 3. The ion beam 3 is stationary. The heater 12 is contained in the heater housing 11 and is located so as to be opposite to the wafers 5 in a lower section of the rotary disk 7.

The rotary disk 7 is rotated about the axis 8 in the direction of the arrow C and is reciprocated about the swinging axis 13 in the directions of the arrows A and B. The ion beam 3 falls on the wafers 5 while the rotary disk 7 is rotated and swung to introduce the ions into the wafers 5. The heater 12 for heating the wafers 5 is swung together with the rotary disk 7 to heat the wafers 5 at all times, which is illustrated in FIGS. 3 and 4.

Figure 3:
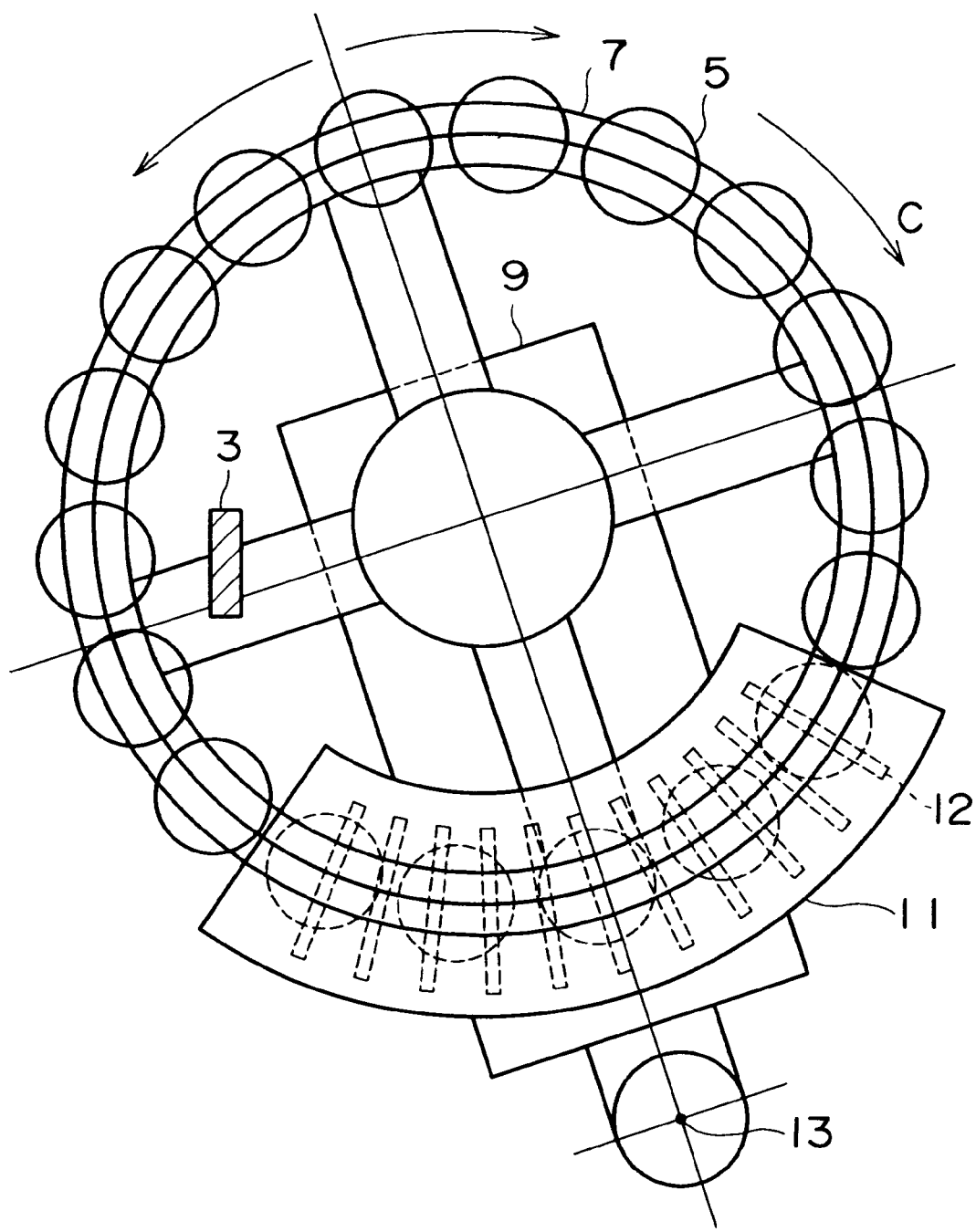
FIG. 3 is a front elevation of the rotary disk included in the preferred embodiment according to the present invention in a scanning operation.
Figure 4:
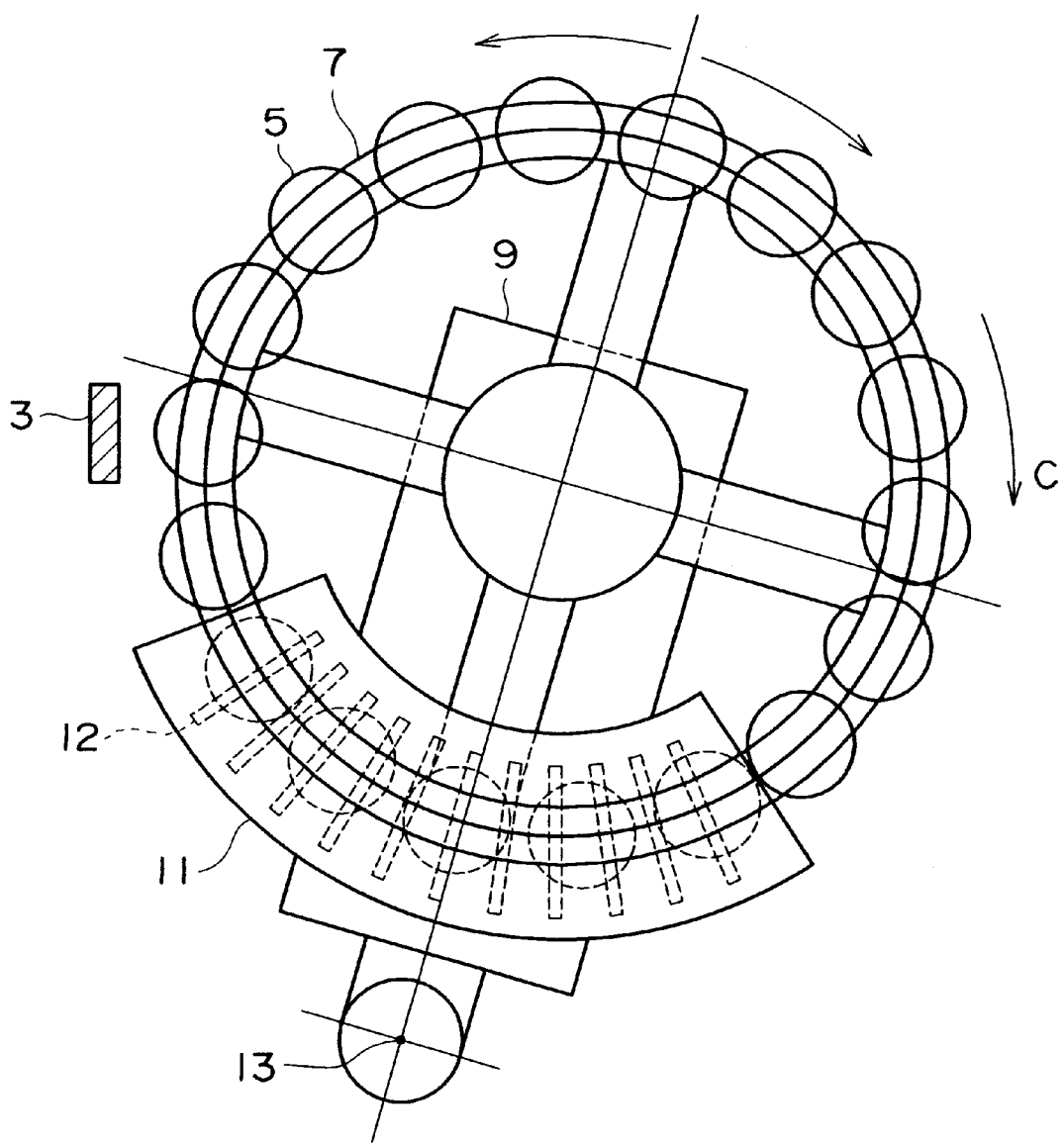
FIG. 4 is a front elevation of the rotary disk included in the preferred embodiment according to the present invention in a scanning operation.

FIG. 3 shows the rotary disk 7 shown in FIG. 2 in a state where the rotary disk 7 has been turned about the swinging axis 13 in the direction of the arrow A, and FIG. 4 shows the rotary disk 7 shown in FIG. 2 in a state where the rotary disk 7 has been turned about the swinging axis 13 in the direction of the arrow B. Since the heater housing 11 is attached to the swing box 9, even if the rotary disk 7 turns in the direction A or B the heater housing 11 swings together with the swing box 9, the heater 12 swings together with the rotary disk 7, and hence the wafers 5 and the heater 12 are kept always in the same positional relation.

Thus, the heater 12 is kept at an optimum heating position relative to the rotary disk 7 even if the rotary disk 7 holding the wafers 5 swings, swings together with the rotary disk 7, and is capable of properly and uniformly heating the wafers 5 at a high temperature irrespective of an operating position of the rotary disk 7.

Figure 5:
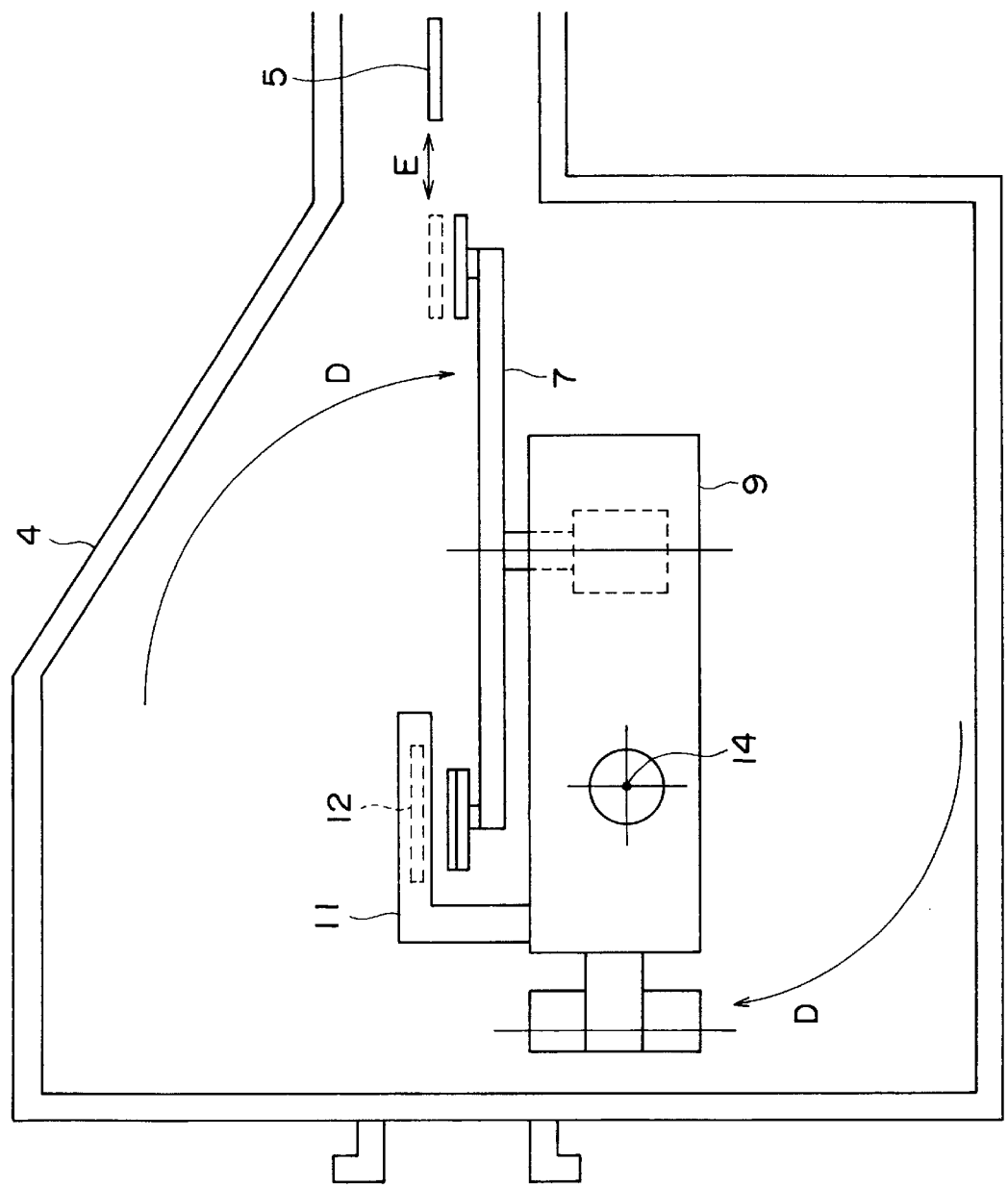
FIG. 5 is a schematic view of the ion implanting system in the preferred embodiment including a wafer carrying mechanism.

A wafer carrying mechanism disposed on the rotary disk 7 will be described. Referring to FIG. 5, when mounting the wafers 5 on the rotary disk 7 before an in implanting operation or when removing the wafers 5 from the rotary disk 7 after the ion implanting operation, the rotary disk 7, the swing box 9 and the heater housing 11 are turned in the direction of the arrow D about a tilting axis 14 to a position shown in FIG. 5. Then, the wafers 5 are received or sent out at a position E.

Since the rotary disk 7 is combined with the rotating mechanism, the swinging mechanism the tilting mechanism (mechanism for setting the rotary disk in a tilted position and in an upright position) and the heating unit (heater 12), a heating operation for heating the wafers to prevent the rapid cooling or the wafers after ion implantation can be performed simultaneously with the tilting of the rotary disk 7, so that process time can be reduced. When the rotary disk 7 is tilted to the tilted position, the heater housing 11 is located above the rotary disk 7 and work for the maintenance of the heater 12 is facilitated.

INDUSTRIAL APPLICABILITY

As is apparent from the foregoing description, in the ion implantation system and the ion implantation method according to the present invention, the heating means for heating the wafers held by the wafer holding means is mounted on a relative position changing means for changing the position of the wafer holding means relative to the ion beam in a plane substantially perpendicular to the ion beam and, when introducing the ions having the predetermined mass and separated from the ion beam projected by the ion source into the wafers, the ions can be implanted in the wafers while moving in synchronism with the movement of the relative position changing means for changing the position of the wafers relative to the ion beam while the wafers are heated. Even if the wafer holding means holding the wafers is swung for scanning, the heating means is swung together with the wafer holding means being kept always at an optimum heating position. Therefore, even if the wafer holding means is swing for scanning, the wafers can be uniformly heated at a high temperature at all times.

What is claimed is:

1. An ion implantation system comprising, as principal components:

an ion source;

a mass analyzing system for separating ions having a predetermined mass from an ion beam projected by the ion source; and an end station storing wafers to which an ion beam of the ions having the predetermined mass and separated from the ion beam by the mass analyzing system is applied;

wherein the end station includes a wafer holding means for holding the wafers, a relative position changing means for changing position of the wafer holding means relative to the ion beam in a plane substantially perpendicular to the ion beam, and a heating means for heating the wafers held by the wafer holding means; wherein the heating means is combined with the relative position changing means moves in synchronism with the movement of the relative position changing means.

2. The ion implantation system according to claim 1, wherein the wafer holding means is a rotary disk capable of holding a plurality of wafers on its peripheral part, and the relative position changing means includes a rotating means for rotating the rotary disk in a plane substantially perpendicular to the ion beam and a swinging means for swinging the rotary disk in a plane substantially perpendicular to the ion beam, the heating means is combined with the swinging means, and the swinging means and the heating means move synchronously.

3. The ion implantation system according to claim 2, wherein the rotating means for rotating the rotary disk has a driving mechanism installed in a swing box to rotate the rotary disk about an axis of rotation, and the swinging means for swinging the rotary disk reciprocates the rotary disk laterally about a swinging axis relative to the ion beam to move the rotary disk for scanning, the heating means is combined with the swinging means, and the heating means moves in synchronism with the scanning movement of the rotary disk.

4. The ion implantation system according to claim 3, wherein a heater housing is connected to a lower part of the swing box so as to be opposite to some of the wafers, the heating means is disposed at a position on the heater housing facing some of the wafers and the heating means moves in synchronism with a swing motion of the rotary disk.

5. The ion implantation system according to claim 4, wherein the heating means is a lamp heater.

6. An ion implantation method that introduces ions having a predetermined mass and separated from an ion beam projected by an ion source into heated wafers, said ion implantation method comprising applying an ion beam to the heated wafers moving in synchronism with a relative position changing means that changes the position of the ion beam relative to the wafers.

7. The ion implantation method according to claim 6, wherein the ions implanted in the wafers are oxygen ions.

8. An ion implantation method that introduces ions having a predetermined mass and separated from an ion beam projected by an ion source into heated wafers, said ion implantation method comprising rotating a rotary disk holding a plurality of wafers on its peripheral part and swinging the rotary disk in a plane perpendicular to the ion beam by a swinging means, and applying an ion beam to the wafers as the wafers are moved in synchronism with the movement of the swinging means for swinging the rotary disk in a plane substantially perpendicular to the ion beam.

9. An ion implantation method comprising: rotating a rotary disk holding a plurality of wafers on its peripheral part to turn the wafers by a driving mechanism disposed in a swing box when introducing ions having a predetermined mass and separated from an ion beam projected by an ion source into the wafers, and laterally reciprocating the swing box relative to the ion beam to apply the ion beam to the heated wafers while the rotary disk moves in synchronism with a scanning operation of the swing box.

\* \* \* \* \*